(12) United States Patent
Lee et al.

(10) Patent No.: US 12,308,351 B2
(45) Date of Patent: May 20, 2025

(54) LIGHT EMITTING DIODE COMPONENT AND LIGHT EMITTING DIODE CIRCUIT COMPRISING P-N DIODES IN SERIES

(71) Applicant: AU OPTRONICS CORPORATION, Hsin-Chu (TW)

(72) Inventors: June-Woo Lee, Hsin-Chu (TW); Yang-En Wu, Hsin-Chu (TW); Sung-Yu Su, Hsin-Chu (TW); Hsien-Chun Wang, Hsin-Chu (TW); Ya-Jung Wang, Hsin-Chu (TW); Chia-Ting Hsieh, Hsin-Chu (TW); Chien-Fu Huang, Hsin-Chu (TW); Hsin-Ying Lin, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 510 days.

(21) Appl. No.: 17/723,856

(22) Filed: Apr. 19, 2022

(65) Prior Publication Data
US 2022/0336425 A1    Oct. 20, 2022

Related U.S. Application Data

(60) Provisional application No. 63/177,345, filed on Apr. 20, 2021.

(30) Foreign Application Priority Data

Mar. 30, 2022    (TW) .................................. 111112306

(51) Int. Cl.
| H01L 25/075 | (2006.01) |
| H10H 20/831 | (2025.01) |
| H10H 20/857 | (2025.01) |

(52) U.S. Cl.
CPC ..... H01L 25/0753 (2013.01); H10H 20/8312 (2025.01); H10H 20/857 (2025.01)

(58) Field of Classification Search
CPC ................................................... H01L 25/0753
USPC ......................................................... 257/103
See application file for complete search history.

(56) References Cited

U.S. PATENT DOCUMENTS

| 2008/0017871 A1 | 1/2008 | Lee et al. |
| 2008/0211421 A1 | 9/2008 | Lee et al. |
| 2008/0315778 A1 | 12/2008 | Tatsukawa |
| 2009/0134422 A1 | 5/2009 | Sah |
| 2010/0109031 A1 | 5/2010 | Lee et al. |
| 2010/0277084 A1 | 11/2010 | Lee et al. |

(Continued)

FOREIGN PATENT DOCUMENTS

| CN | 106572562 A | 4/2017 |
| JP | 2003264314 A | 9/2003 |

(Continued)

*Primary Examiner* — Ajay Arora
(74) *Attorney, Agent, or Firm* — WPAT, PC

(57) ABSTRACT

The present disclosure provides a light emitting diode component, including a body and a plurality of P-N diode structures. The P-N diode structures are coupled in series and integrated on the body. The P-N diode structures include a plurality of p-type doping layers and a plurality of n-type doping layers. The p-type doping layer of a first P-N diode structure in the P-N diode structures is electrically coupled to the n-type doping layer of a second P-N diode structure in the P-N diode structures.

18 Claims, 7 Drawing Sheets

(56) References Cited

U.S. PATENT DOCUMENTS

| | | |
|---|---|---|
| 2010/0289040 A1 | 11/2010 | Seo et al. |
| 2011/0031891 A1 | 2/2011 | Lee et al. |
| 2011/0037397 A1 | 2/2011 | Lee et al. |
| 2011/0062465 A1 | 3/2011 | Lee et al. |
| 2011/0210350 A1 | 9/2011 | Lee et al. |
| 2012/0135551 A1 | 5/2012 | Seo et al. |
| 2012/0217885 A1 | 8/2012 | Lee et al. |
| 2012/0235583 A1 | 9/2012 | Lee et al. |
| 2012/0292646 A1 | 11/2012 | Nagai |
| 2013/0026924 A1 | 1/2013 | Jong et al. |
| 2013/0026931 A1 | 1/2013 | Jong et al. |
| 2013/0026935 A1 | 1/2013 | Jong et al. |
| 2013/0169174 A1 | 7/2013 | Lee et al. |
| 2013/0228802 A1 | 9/2013 | Wang et al. |
| 2013/0277682 A1 | 10/2013 | Lee et al. |
| 2013/0342115 A1* | 12/2013 | Yang .................. H05B 45/00 315/185 R |
| 2014/0028204 A1 | 1/2014 | Lee et al. |
| 2014/0131657 A1* | 5/2014 | Kim .................. H01L 33/38 257/13 |
| 2015/0028369 A1 | 1/2015 | Wang et al. |
| 2015/0195872 A1 | 7/2015 | Lee et al. |
| 2015/0262980 A1 | 9/2015 | Wang et al. |
| 2015/0312977 A1 | 10/2015 | Jong et al. |
| 2016/0345398 A1 | 11/2016 | Lee et al. |
| 2018/0247922 A1 | 8/2018 | Robin |
| 2018/0337315 A1 | 11/2018 | Yu et al. |
| 2021/0051781 A1 | 2/2021 | Song |

FOREIGN PATENT DOCUMENTS

| | | |
|---|---|---|
| JP | 2004279668 A | 10/2004 |
| JP | 2008544569 A | 12/2008 |
| JP | 2009004483 A | 1/2009 |
| JP | 2010034610 A | 2/2010 |
| JP | 2010205777 A | 9/2010 |
| JP | 2011159722 A | 8/2011 |
| JP | 2013172147 A | 9/2013 |
| JP | 2018534786 A | 11/2018 |
| KR | 20130058303 A | 6/2013 |
| KR | 20150020632 A | 2/2015 |
| TW | I709953 B | 11/2020 |
| WO | WO 2009084857 A2 | 7/2009 |

* cited by examiner

LIGHT EMITTING DIODE COMPONENT AND LIGHT EMITTING DIODE CIRCUIT COMPRISING P-N DIODES IN SERIES

CROSS-REFERENCE TO RELATED APPLICATION

This application claims priority to U.S. Provisional Application Ser. No. 63/177,345, filed Apr. 20, 2021, and Taiwan Application Serial Number 111112306, filed Mar. 30, 2022, which are herein incorporated by reference in their entirety.

BACKGROUND

Field of Invention

The present disclosure relates to a light emitting diode (LED) component and an LED circuit. More particularly, the present disclosure relates to an LED component and an LED circuit that include multiple P-N diode structures.

Description of Related Art

Most active-matrix micro-LED displays use driving circuits or transistors to drive LED components each of which has only one diode structure, but such driving approach can result in higher power consumption. In addition, when the diode structure is defected, the whole LED component has to be replaced, and thus manufacturer or consumer of the displays can bear additional costs.

SUMMARY

The present disclosure provides a light emitting diode component, including a body and multiple P-N diode structures. The P-N diode structures are coupled in series with each other, laterally arranged to be adjacent to each other, and integrated on the body. The P-N diode structures comprise multiple p-type doping layers and multiple n-type doping layers, and the p-type doping layers and the n-type doping layers are correspondingly arranged on the body. The p-type doping layer of a first P-N diode structure of the P-N diode structures is electrically coupled to the n-type doping layer of a second P-N diode structure of the P-N diode structures, and the second P-N diode is adjacent to the first P-N diode.

The present disclosure also provides a light emitting diode circuit in a display device, including multiple transistors and a light emitting diode component. First terminals of the transistors are electrically coupled with each other and configured to receive a first reference voltage. The light emitting diode component is electrically coupled between the transistors and a second reference voltage. The light emitting diode component includes multiple P-N diodes, and the P-N diodes are coupled in series with each other and integrated on a single chip. The transistors are configured to drive the light emitting diode component to emit light, and a second terminal of each of the transistors is electrically coupled to an anode of a corresponding one of the P-N diodes.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
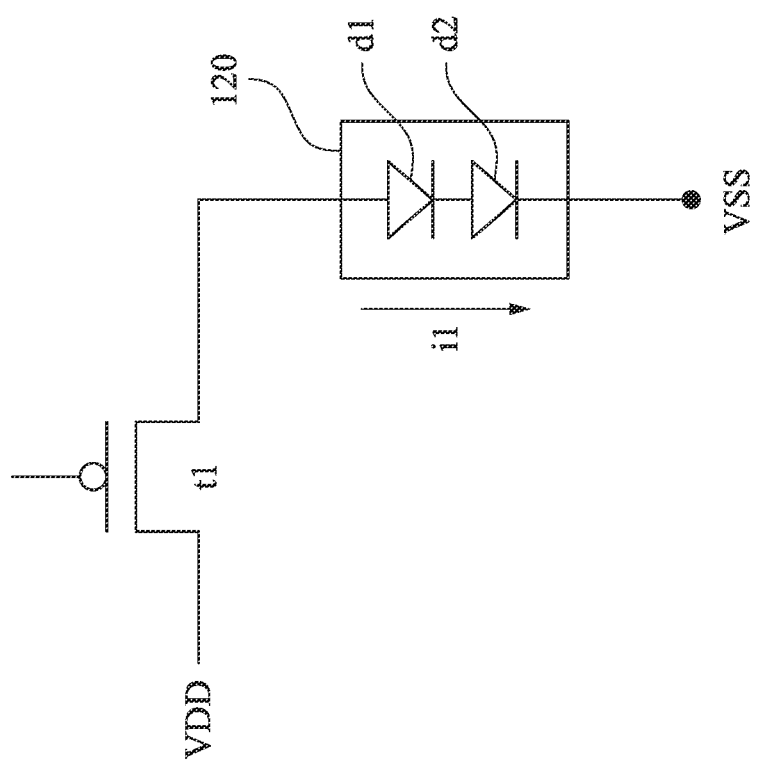
FIG. 1 is a diagram of an LED circuit in accordance with some embodiments of the present disclosure.

Reference will now be made in detail to embodiments of the present disclosure, examples of which are described herein and illustrated in the accompanying drawings. While the disclosure will be described in conjunction with embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. It is noted that, in accordance with the standard practice in the industry, the drawings are only used for understanding and are not drawn to scale. Hence, the drawings are not meant to limit the actual embodiments of the present disclosure. In fact, the dimensions of the various features may be arbitrarily increased or reduced for clarity of discussion. Wherever possible, the same reference numbers are used in the drawings and the description to refer to the same or like parts for better understanding.

The terms used in this specification generally have their ordinary meanings in the art, within the context of the invention, and in the specific context where each term is used.

As used in the present disclosure, the terms "comprising," "including," "having," "containing," "involving," and the like are to be understood to be open-ended, i.e., to mean including but not limiting to. In addition, as used in the present disclosure, the term "and/or" includes any and all combinations of one or more of the associated listed items. Moreover, it will be understood that, although the terms "first," "second," etc., may be used herein to describe various elements, these elements should not be limited by these terms. These terms are used to distinguish one element from another.

Most active-matrix micro-LED displays use driving circuits or transistors to drive LED components each of which has only one diode structure, but such driving approach can result in higher power consumption. One embodiment of the present disclosure provides an LED component that integrates multiples P-N diode structures. Please refer to FIG. 1. FIG. 1 is a diagram of an LED circuit in accordance with some embodiments of the present disclosure. The LED circuit shown in FIG. 1 uses a transistor t1 to drive an LED component 120. The transistor t1 receives a reference voltage VDD and is electrically coupled to the LED component 120, and the LED component 120 is electrically coupled to a reference voltage VSS. The LED component 120 includes two P-N diode structures d1 and d2 that are coupled in series with each other, and the P-N diode structures d1 and d2 are integrated as the LED component 120.

In operation, a first terminal of the transistor t1 receives the reference voltage VDD, and, in response to a gate terminal of the transistor t1 receiving a gate driving signal and the transistor t1 being turned on, the transistor t1 transmits the reference voltage VDD to the LED component 120. When a voltage difference between the two ends of the LED component 120 is larger than the combining forward voltages of the P-N diode structures d1 and d2, the P-N diode structures d1 and d2 are conducted, and a current i1 passes through the P-N diode structures d1 and d2.

In some embodiments, the P-N diode structures d1 and d2 have the same structures, physical properties, and/or forward voltages. In alternative embodiments, the P-N diode structures d1 and d2 have different structures, physical properties, and/or forward voltages.

Compared with the above-mentioned driving approach that uses transistors to drive LED components each of which has only one diode structure, the LED circuit in FIG. 1 can use smaller current to reach the same brightness because the LED component 120 in FIG. 1 includes two P-N diode structures d1 and d2. Because the current i1 is smaller, the LED circuit shown in FIG. 1 has lower power consumption.

Figure 2:
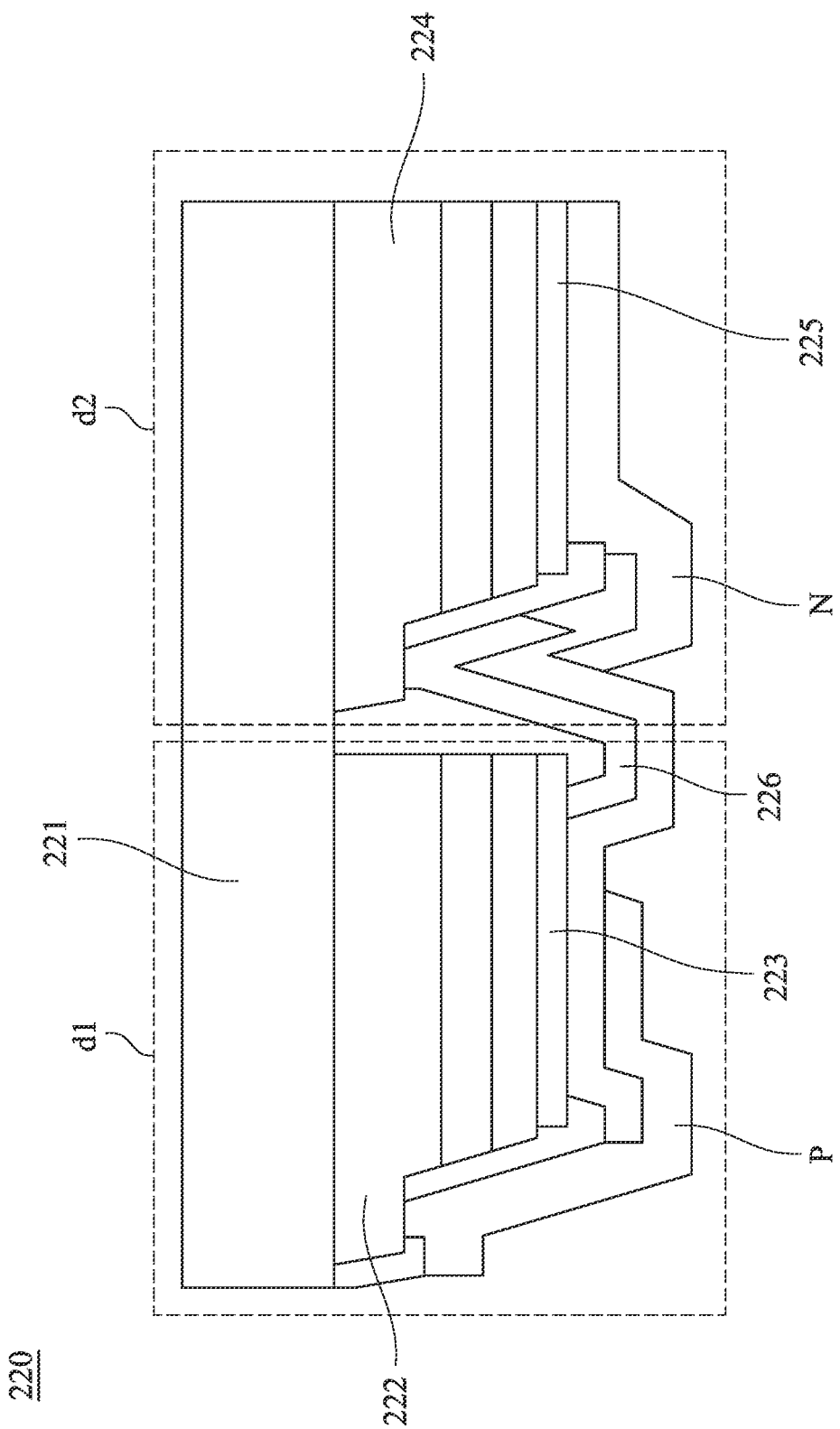
FIG. 2 is a diagram of a structure of an LED component in accordance with some embodiments of the present disclosure.

Please refer to FIG. 2. FIG. 2 is a diagram of a structure of an LED component 220 in accordance with some embodiments of the present disclosure. In some embodiments, the LED component 120 in FIG. 1 has a structure similar to the structure of the LED component 220 as shown in FIG. 2. The LED component 220 includes P-N diode structures d1 and d2, which correspond to the P-N diode structures d1 and d2 shown in FIG. 1.

As shown in FIG. 2, each of the P-N diode structures d1 and d2 has the typical structure of a P-N diode. For example, in some embodiments, the P-N diode structure d1 includes a body 221, a p-type doping layer 222 including p-type dopant(s), an active layer having structures of multiple quantum well (MQW), an n-type doping layer 223 including n-type dopant(s), and an electrode P. Similarly, the P-N diode structure d2 includes the body 221, a p-type doping layer 224, an active layer, an n-type doping layer 225, and an electrode N. The P-N diode structures d1 and d2 are integrated on the body 221 together. In some embodiments, the P-N diode structures d1 and d2 are electrically coupled with each other through a conductive interconnect structure 226. For example, as shown in FIG. 2, the n-type doping layer 223 of the P-N diode structure d1 is electrically coupled to the p-type doping layer 224 of the P-N diode structure d2 through the interconnect structure 226, so that the P-N diode structures d1 and d2 are coupled in series with each other and can be used as the LED component 120 in the LED circuit shown in FIG. 1.

In the LED component 120 in FIG. 1 and the LED component 220 in FIG. 2, only two P-N diode structures d1 and d2 are coupled in series with each other. One embodiment of the present disclosure provides an LED component that includes more P-N diode structures coupled in series.

Figure 3B:
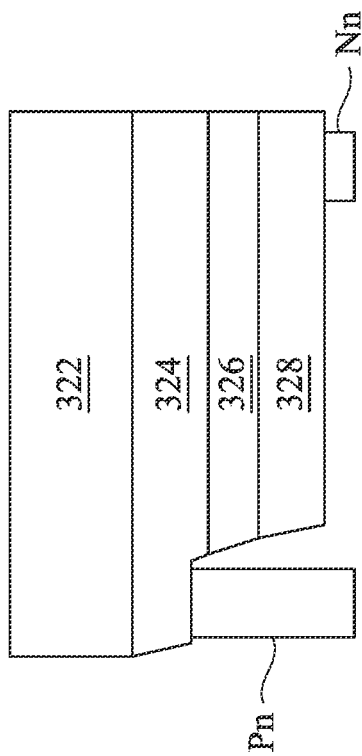
FIG. 3B is a cross-section view of the LED component in FIG. 3A in accordance with some embodiments of the present disclosure.
Figure 3A:
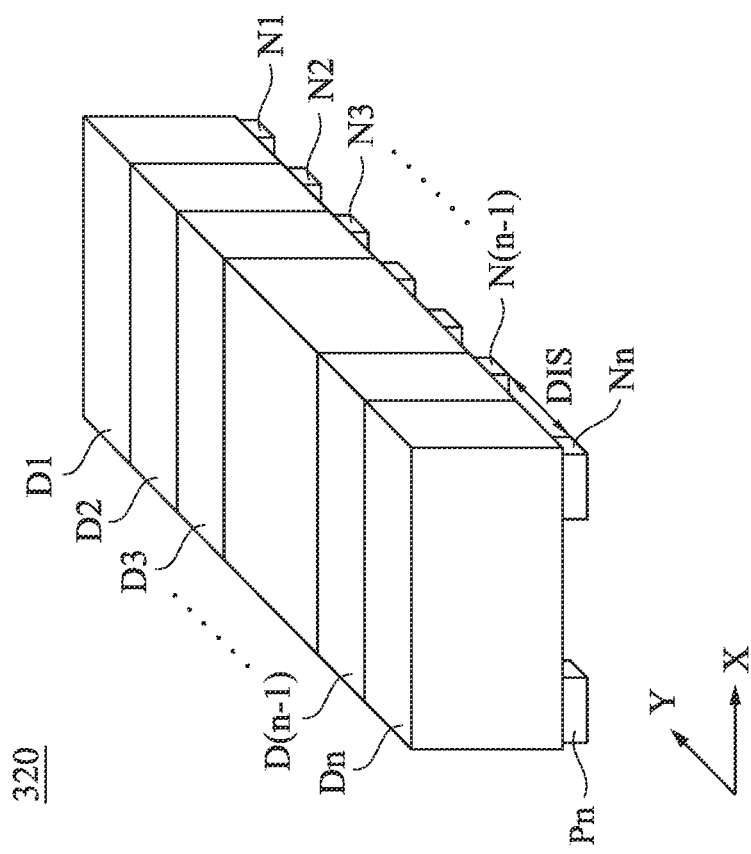
FIG. 3A is a diagram of an LED component in accordance with some embodiments of the present disclosure.

Please refer to FIG. 3A. FIG. 3A is a diagram of an LED component 320 in accordance with some embodiments of the present disclosure. The LED component 320 includes P-N diode structures D1~Dn. The P-N diode structures D1~Dn are coupled in series with each other, laterally arranged to be adjacent to each other, and integrated as a single structure. For example, as shown in FIG. 3A, each of the P-N diode structures D1~Dn extends along a horizontal direction (e.g., the X direction in FIG. 3A), and the P-N diode structures D1~Dn are laterally arranged along a direction that is traverse to the horizontal direction (e.g., the Y direction in FIG. 3A) to be adjacent to each other.

In some embodiments, each of the P-N diode structures D1~Dn is electrically coupled to the corresponding electrode pads. Specifically, the P-N diode structure D1 is electrically coupled to electrode pads P1 (not shown in FIG. 3A for the clarity of the figure) and N1, the electrode N1 is arranged at a relatively right part of the bottom of the P-N diode structure D1, and the electrode P1 is arranged at a relatively left part of the bottom of the P-N diode structure DE Similarly, the P-N diode structures D2~Dn are electrically coupled to corresponding electrode pads P2~Pn and N2~Nn.

In some embodiments, the electrode pads P1~Pn are used as the anodes of the P-N diode structures D1~Dn and the electrode pads N1~Nn are used as the cathodes of the P-N diode structures D1~Dn, while the anodes are configured to receive relatively high voltages and the cathodes are configured to receive relatively low voltages.

In some embodiments, the electrode pad N1 of the P-N diode structure D1 is electrically coupled to the electrode pad P2 (not shown in FIG. 3A for the clarity of the figure) of the P-N diode structure D2 through an interconnect structure, the electrode pad N2 of the P-N diode structure D2 is electrically coupled to the electrode pad P3 (not shown in FIG. 3A for the clarity of the figure) of the P-N diode structure D3 through an interconnect structure, the electrode pad N3 of the P-N diode structure D3 is electrically coupled to the electrode pad P4 (not shown in FIG. 3A for the clarity of the figure) of the P-N diode structure D4 through an interconnect structure, and so on. Lastly, the electrode pad N(n−1) of the P-N diode structure D(n−1) is electrically coupled to the electrode pad Pn of the P-N diode structure Dn through an interconnect structure. Based on these coupling/connection relationships, the P-N diode structures D1~Dn are coupled in series with each other. The series connection of the P-N diode structures D1~Dn will be further discussed through FIG. 6 and in later paragraphs.

In some embodiments, the electrode pads are spaced apart from each other by about 3-300 μm. For example, in FIG. 3A, a distance DIS between the electrode pad N(n−1) of the P-N diode structure D(n−1) and the electrode pad Nn of the P-N diode structure Dn is about 3-300 μm.

In some embodiments, the P-N diode structures D1~Dn are integrated on the same body. Please refer to FIG. 3B. FIG. 3B is a cross-section view of the LED component 320 in FIG. 3A in accordance with some embodiments of the present disclosure. As shown in FIG. 3B, each of the P-N diode structures D1~Dn in FIG. 3A includes a p-type doping layer 324, an active layer 326, and an n-type doping layer 328. These three layers are correspondingly arranged, such that they are arranged as one P-N diode structure. In other words, each of the P-N diode structures D1~Dn includes the p-type doping layer 324, the active layer 326, and the n-type doping layer 328, and the p-type doping layer 324, the active layer 326, and the n-type doping layer 328 of the P-N diode structures D1~Dn are integrated on the same body 322.

In the embodiment shown in FIG. 3B, the p-type doping layer 324 is arranged between the n-type doping layer 328 and the body 322. In some embodiments, the p-type doping layer 324 of one of adjacent two P-N diode structures of the P-N diode structures D1~Dn is electrically coupled to the n-type doping layer 328 of the other of the adjacent two P-N diode structures of the P-N diode structures D1~Dn through an interconnect structure (such as an interconnect structure CON in FIG. 6 that will be further discussed in later paragraphs).

In some embodiments, the electrode pads P1~Pn and N1~Nn in FIG. 3A are electrically coupled to the P-N diode structures D1~Dn through the structure shown in FIG. 3B. Specifically, as shown in FIG. 3B, the electrode pad Pn is electrically coupled to the p-type doping layer 324 of the P-N diode structure Dn, and the electrode pad Nn is electrically coupled to the n-type doping layer 328 of the P-N diode structure Dn. In some embodiments, the electrode pads P1~P(n−1) are electrically coupled to the p-type doping layers 324 of the corresponding P-N diode structures D1~D(n−1) in a similar approach, and the electrode pads N1~N(n−1) are electrically coupled to the n-type doping layers 328 of the corresponding P-N diode structures D1~D(n−1) in a similar approach.

In some embodiments, in operation, when the electrode pad Pn receives a relatively high voltage and the electrode pad Nn receives a relatively low voltage, a current is formed and flows from the electrode pad Pn to the p-type doping layer 324, the active layer 326, the n-type doping layer 328, and then the electrode pad Nn. When the current passes through the active layer 326, the P-N diode structure Dn emits light.

In some embodiments, the electrode pads P1~Pn and N1~Nn are all exposed as independent electrodes. Accordingly, when the LED component 320 is used in a circuit, the electrode pads P1~Pn and N1~Nn can be used as independent electrodes and can be configured to electrically couple to different pins, circuit, or electrical components, or receive different signals.

Figure 4B:
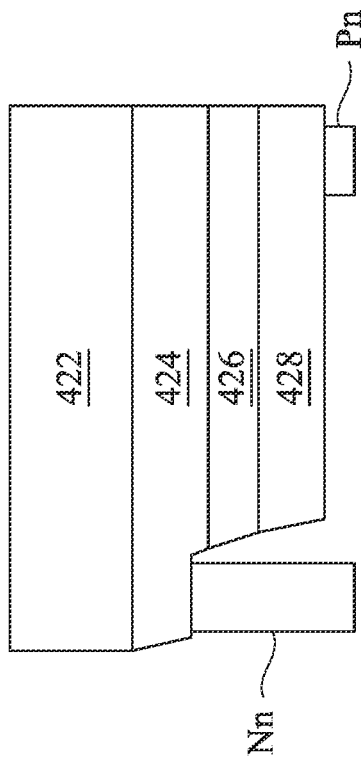
FIG. 4B is a cross-section view of the LED component in FIG. 4A in accordance with some embodiments of the present disclosure.
Figure 4A:
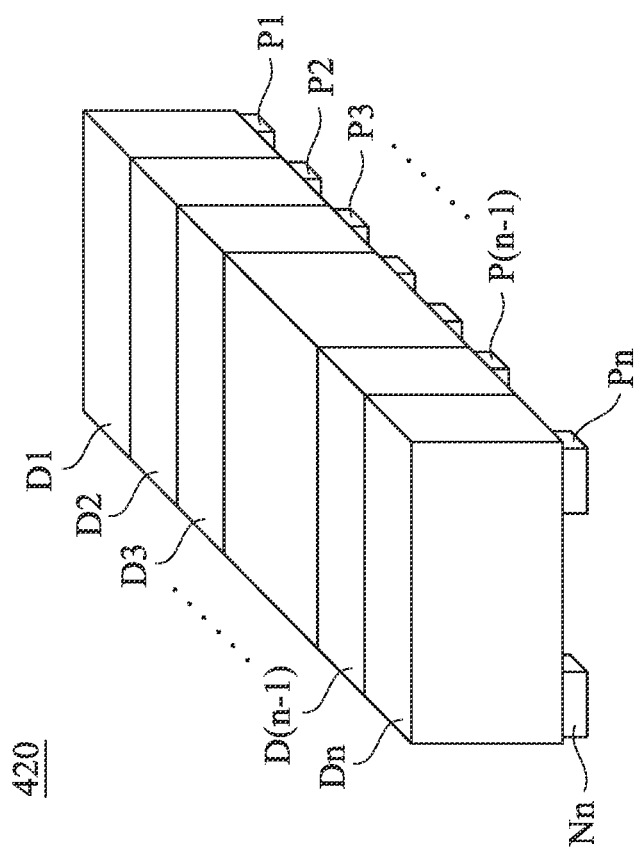
FIG. 4A is a diagram of an LED component in accordance with some embodiments of the present disclosure.

It should be noted that the embodiments of FIGS. 3A and 3B are merely exemplary. In some embodiments, an LED component including multiple P-N diode structures coupled in series can have a structure of the one shown in FIG. 4A or 4B. Please refer to FIGS. 4A and 4B. FIG. 4A is a diagram of an LED component 420 in accordance with some embodiments of the present disclosure. FIG. 4B is a cross-section view of the LED component 420 in FIG. 4A in accordance with some embodiments of the present disclosure. In FIG. 4A, the LED component 420 has the P-N diode structures D1~Dn coupled in series as well. However, unlike the embodiment of FIG. 3A, the electrodes N1~Nn are arranged at the relatively left parts of the bottom of the P-N diode structures D1~Dn, and the electrodes P1~Pn are arranged at the relatively right parts of the bottom of the P-N diode structures D1~Dn.

In some embodiments, the electrode pad N1 (not shown in FIG. 4A for the clarity of the figure) of the P-N diode structure D1 is electrically coupled to the electrode pad P2 of the P-N diode structure D2 through an interconnect structure, the electrode pad N2 (not shown in FIG. 4A for the clarity of the figure) of the P-N diode structure D2 is electrically coupled to the electrode pad P3 of the P-N diode structure D3 through an interconnect structure, the electrode pad N3 (not shown in FIG. 4A for the clarity of the figure) of the P-N diode structure D3 is electrically coupled to the electrode pad P4 of the P-N diode structure D4 through an interconnect structure, and so on. Lastly, the electrode pad N(n−1) (not shown in FIG. 4A for the clarity of the figure) of the P-N diode structure D(n−1) is electrically coupled to the electrode pad Pn of the P-N diode structure Dn through an interconnect structure. Through these coupling/connection relationships, the P-N diode structures D1~Dn are coupled in series with each other.

In some embodiments, the LED component 420 in FIG. 4A has a structure as the one shown in FIG. 4B. Each of the P-N diode structures D1~Dn has a n-type doping layer 424, an active layer 426, and a p-type doping layer 428, and the P-N diode structures D1~Dn are integrated on the same body 422 together. As shown in FIG. 4B, the electrode pad Pn of the P-N diode structure Dn is electrically coupled to the p-type doping layer 428, the electrode pad Nn of the P-N diode structure Dn is electrically coupled to the n-type doping layer 424, and the electrode pads P1~P(n−1) and N1~N(n−1) of the P-N diode structures D1~D(n−1) are electrically coupled to the p-type doping layer 428 and the n-type doping layer 424 through similar connection relationships. In operation, when the electrode pads P1~Pn receive relatively high voltages and the electrode pads N1~Nn receive relatively low voltages, currents will flow from the electrode pads P1~Pn to the p-type doping layer 428, the active layer 426, the n-type doping layer 424, and then the electrode pads N1~Nn.

Figure 5:
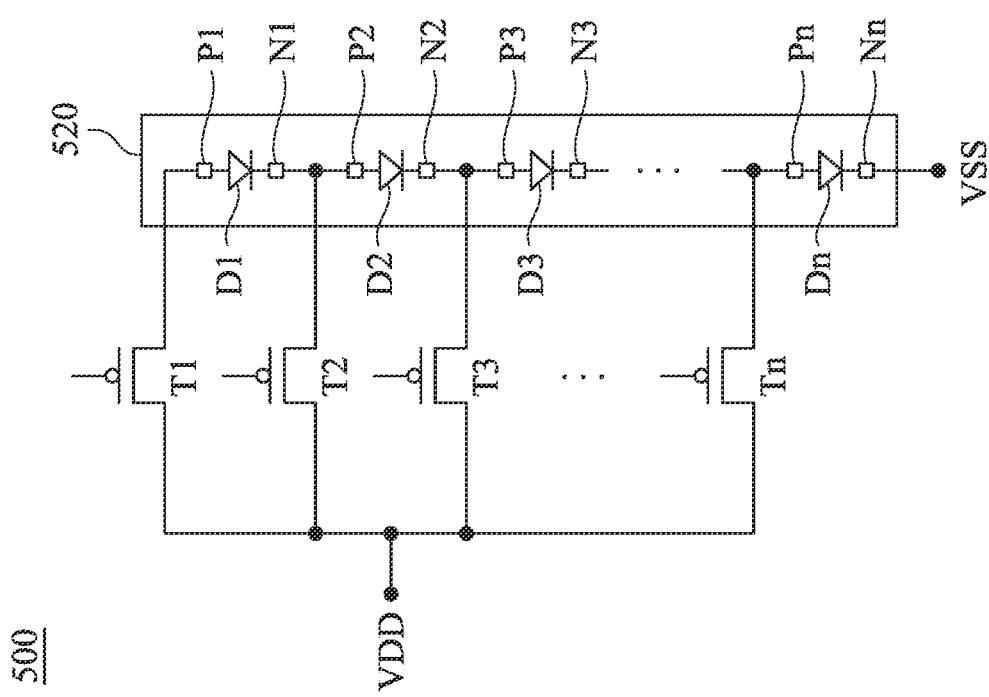
FIG. 5 is a diagram of an LED circuit in a display device in accordance with some embodiments of the present disclosure.

As previously described, the LED components in FIGS. 3A-4B all have multiple P-N diode structures coupled in series with each other. The present disclosure also provides an LED circuit in a display device, wherein the LED circuit includes such LED component. Please refer to FIG. 5. FIG. 5 is a diagram of an LED circuit 500 in a display device in accordance with some embodiments of the present disclosure. The LED circuit 500 includes transistors T1~Tn and an LED component 520. The first terminals of the transistors T1~Tn are electrically coupled with each other and are configured to receive the reference voltage VDD, the second terminals of the transistors T1~Tn are configured to drive the LED component 520 to emit light. The LED component 520 is electrically coupled between the transistors T1~Tn and the reference voltage VSS.

The LED component 520 includes multiple P-N diodes D1~Dn, and the P-N diodes D1~Dn are coupled in series with each other and integrated on a single chip. In other words, the LED component 520 is a single chip in the LED circuit 500, and the LED circuit 500 uses the transistors T1~Tn to drive this chip to emit light.

In some embodiments, as shown in FIG. 5, the LED component 520 includes the electrode pads P1~Pn and N1~Nn, and each of the electrode pads P1~Pn and N1~Nn is electrically coupled between the corresponding one of the P-N diodes D1~Dn and the corresponding one of the transistors T1~Tn. Specifically, the electrode P1 is electrically coupled between the anode of the P-N diode D1 and the transistor T1, the electrode N1 is electrically coupled between the cathode of the P-N diode D1 and the transistor T2, the electrode P2 is electrically coupled between the anode of the P-N diode D2 and the transistor T2, the electrode N2 is electrically coupled between the cathode of the P-N diode D2 and the transistor T3, and so on. Lastly, the electrode Pn is electrically coupled between the anode of the P-N diode Dn and the transistor Tn, and the electrode Nn is electrically coupled between the cathode of the P-N diode Dn and the reference voltage VSS.

In some embodiments, the electrode pads P1~Pn and N1~Nn of the LED component 520 are exposed as independent electrodes, so the transistors T1~Tn can electrically couple to the electrode pads P1~Pn and N1~Nn through electric lines.

Figure 6:
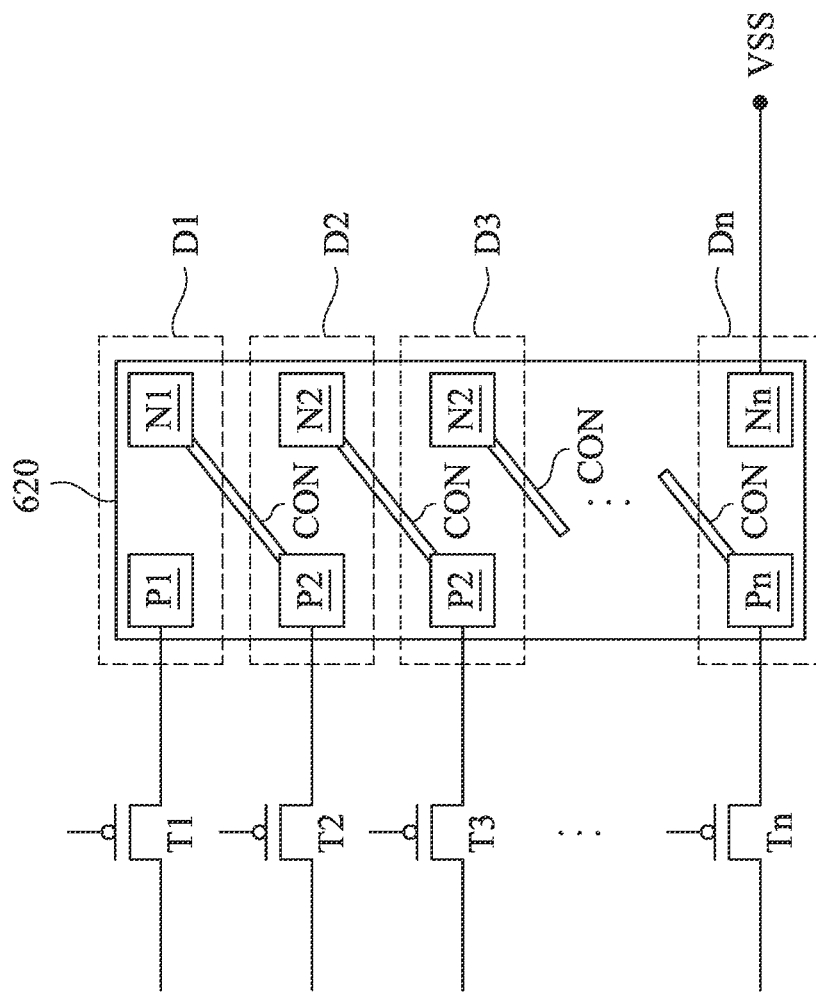
FIG. 6 is a diagram of part of the LED circuit in FIG. 5 in accordance with some embodiments of the present disclosure.

In some embodiments, the LED component 520 has a structure of the one shown in FIG. 3A, and the LED circuit 500 is configured to drive an LED component such as the LED component 320 through the transistors T1~Tn. Please refer to FIG. 6. FIG. 6 is a diagram of part of the LED circuit 500 in FIG. 5 in accordance with some embodiments of the present disclosure. The LED component 620 in FIG. 6 corresponds to the LED component 520 in FIG. 5 and has a structure similar to the structure of the LED component 320 in FIG. 3A. In FIG. 6, the P-N diodes structures D1~Dn are integrated as the LED component 620, and each of the P-N diodes structures D1~Dn is electrically coupled to the corresponding electrode pads. For example, the P-N diode structure D1 is electrically coupled to the electrode pads P1 and N1, as shown in FIG. 6.

In some embodiments, the electrode pad N1 of the P-N diode structure D1 is electrically coupled to the electrode pad P2 of the P-N diode structure D2 through the interconnect structure CON, so that the P-N diode structures D1 and D2 are coupled in series with each other. Similarly, the electrode pads of the P-N diode structures D2~Dn are electrically coupled through the interconnect structure CON as shown in FIG. 6, so that the P-N diode structures D2~Dn are coupled in series with each other as well.

In some embodiments, the n-type doping layer of one of adjacent two P-N diode structures of the P-N diodes structures D1~Dn is electrically coupled to the p-type doping layer of the other of the adjacent two P-N diode structures of the P-N diodes structures D1~Dn through the interconnect structure CON. For example, the n-type doping layer of the P-N diode structure D1 is electrically coupled to the p-type doping layer of the P-N diode structure D2 through the interconnect structure CON.

Figure 7B:
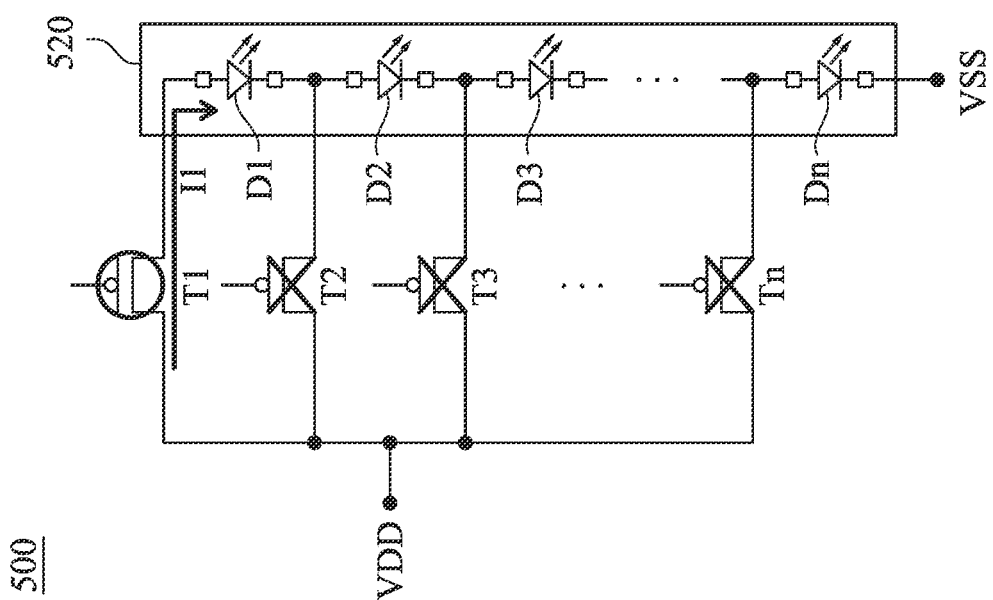
FIG. 7B is a diagram of the LED circuit in FIG. 5 operating in a light-emitting period in accordance with some embodiments of the present disclosure.
Figure 7A:
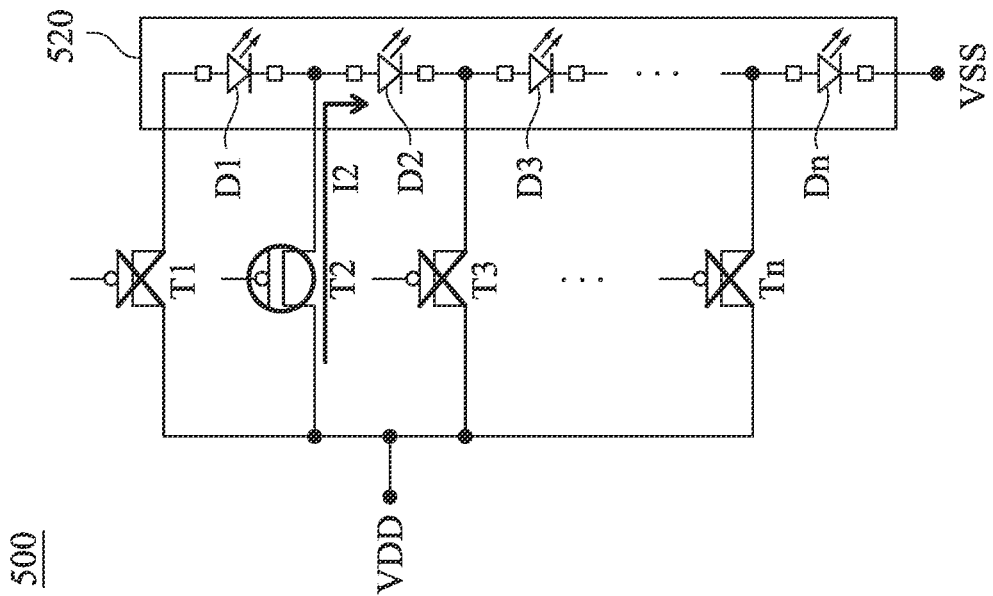
FIG. 7A is a diagram of the LED circuit in FIG. 5 operating in a light-emitting period in accordance with some embodiments of the present disclosure.

Please refer to FIG. 7A. FIG. 7A is a diagram of the LED circuit 500 in FIG. 5 operating in a light-emitting period in accordance with some embodiments of the present disclosure. In the embodiment of FIG. 7A, the gate terminal of the transistor T1 receives a gate driving signal, and the transistor T1 is turned on and transmits the reference voltage VDD to the P-N diode structure DE Because the P-N diode structures D1~Dn are coupled in series with each other, a current Il will pass through the transistor T1, the P-N diode structures D1, D2 . . . and lastly the P-N diode structure Dn. All of the P-N diode structures D1~Dn will thus emit light. In other words, in the embodiment of FIG. 7A, only the transistor T1 needs to be turned on in order to drive all the P-N diode structures D1~Dn in the LED component 520 to emit light.

In some embodiments, the gate driving signal that the gate terminal of the transistor T1 receives is provided by a gate driving circuit. In some embodiments, the LED circuit 500 further includes a gate driving circuit that is electrically coupled to the gate terminals of the transistors T1~Tn, and the gate driving circuit is configured to provide gate driving signals to the transistors T1~Tn to turn on one or more of the transistors T1~Tn.

On the other hand, if one of the P-N diode structures D1~Dn in the LED component 520 is defected, the LED circuit 500 can decide which transistor to be turned on in order to conduct the P-N diode structures that are not defected, and there is no need to replace the whole LED component 520. Please refer to FIG. 7B. FIG. 7B is a diagram of the LED circuit 500 in FIG. 5 operating in a light-emitting period in accordance with some embodiments of the present disclosure. Assuming that the P-N diode structure D1 is defected in the embodiment of FIG. 7B, a gate driving signal is then provided to the gate terminal of the transistor T2, and the transistor T2 is turned on and transmits the reference voltage VDD to the P-N diode structure D2. Because of the series connection of the P-N diode structures D2~Dn, the P-N diode structures D2~Dn will emit light. In other words, when a P-N diode structure Dm of the P-N diode structures D1~Dn (i.e., the $m^{th}$ P-N diode structure of the P-N diode structures D1~Dn) is defected, the gate driving signal is provided to the gate terminal of the transistor T(m+1) (i.e., the $(m+1)^{th}$ transistor of the transistors T1~Tn), and the transistor T(m+1) transmits the reference voltage VDD to the P-N diode structure D(m+1), so that the P-N diode structures D(m+1)~Dn will emit light. In other words, the LED circuit 500 can avoid, or bypass, the defected P-N diode structure(s) and drive the P-N diode structure(s) that are not defected to emit light.

In some embodiments, the LED circuit 500 further includes a detection circuit configured to detect whether there is a current passing through the LED component 520. By using such detection circuit, it can be assured that whether there is any defected P-N diode structure in the LED component 520. For example, in the case where the gate terminal of the transistor T1 receives the gate driving signal but the detection circuit does not detect a current passing through the LED component 520, it is assured that the P-N diode structure D1 that is electrically coupled to the transistor T1 is defected.

In some embodiments, the transistors T1~Tn in the LED circuit 500 are turned on in a sequential order (i.e., the transistors T1~Tn are turned on one by one) until at least one of the P-N diode structures D1~Dn emits light. In such embodiments, the gate terminals of the transistors T1~Tn receive the gate driving signal sequentially and the transistors T1~Tn are turned on respectively in order to drive the LED component 520 to emit light.

In some embodiments, the LED circuit 500 can decide which one of the transistors T1~Tn to be turned on according to the size of the reference voltage VDD or the specification or power consumption of the LED circuit 500. For example, if a designer of the LED circuit 500 intends to minimize power consumption as much as possible while achieving high brightness, a small current can be used to drive a number of n P-N diode structures D1~Dn to emit light, and such approach can help lower the power consumption of the LED circuit 500.

In conclusion, in the various embodiments of the present disclosure, multiple series-coupled P-N diode structures are integrated as a single LED component, and such LED component can be used in an LED circuit to emit light and save power consumption. In addition, if multiple transistors are electrically coupled to the electrodes of the corresponding P-N diode structures of such LED component, one or more of the P-N diode structures can be selected to be turned on. Therefore, when one P-N diode structure is defected, the other P-N diode structure that is not defected can be selected and turned on to emit light, and the whole LED component does not have to be replaced.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A light emitting diode component, comprising:
    a body; and
    a plurality of P-N diode structures, wherein the plurality of P-N diode structures are coupled in series with each other, laterally arranged to be adjacent to each other, and integrated on the body;
    wherein the plurality of P-N diode structures comprise a plurality of p-type doping layers and a plurality of n-type doping layers, and the plurality of p-type doping layers and the plurality of n-type doping layers are correspondingly arranged on the body;
    wherein a first P-N diode structure of the plurality of P-N diode structures includes a p-type doping layer of the plurality of p-type doping layers, a second P-N diode structure of the plurality of P-N diode structures includes an n-type doping layer of the plurality of p-type doping layers, and the p-type doping layer of the first P-N diode structure is electrically coupled to the n-type doping layer of the second P-N diode structure, and the second P-N diode is adjacent to the first P-N diode;
    wherein the light emitting diode component further comprises a plurality of first electrode pads electrically coupled to corresponding p-type doping layers in the plurality of P-N diode structures;
    wherein each of the plurality of first electrode pads is electrically coupled to one of a plurality of transistors;
    wherein first terminals of the plurality of transistors are electrically coupled with each other and configured to receive a reference voltage, wherein each one of the plurality of first electrode pads is configured to receive the reference voltage from a second terminal of a corresponding one of the plurality of transistors.

2. The light emitting diode component of claim 1, further comprising:
    a plurality of second electrode pads, electrically coupled to corresponding n-type doping layers in the plurality of P-N diode structures.

3. The light emitting diode component of claim 2, wherein an mth second electrode pad of the plurality of second electrode pads is electrically coupled to a (m+1)th first electrode pad of the plurality of first electrode pads, and m is an integer larger than 1.

4. The light emitting diode component of claim 3, wherein the mth second electrode pad of the plurality of second electrode pads is electrically coupled to the (m+1)th first electrode pad of the plurality of first electrode pads through an interconnect structure.

5. The light emitting diode component of claim 2, wherein adjacent two first electrode pads of the plurality of first electrode pads are spaced apart from each other by about 3-300 μm, and adjacent two second electrode pads of the plurality of second electrode pads are spaced apart from each other by about 3-300 μm.

6. The light emitting diode component of claim 2, wherein the plurality of first electrode pads and the plurality of second electrode pads are all exposed as independent electrodes.

7. The light emitting diode component of claim 1, wherein:
    in response to an mth first electrode pad of the plurality of first electrode pads which receives a reference voltage from a corresponding one of the plurality of transistors, an mth P-N diode structure to an nth P-N diode structure of the plurality of P-N diode structures are conducted and are configured to emit light; and
    m and n are integers larger than 1, and m is smaller than or equal to n.

8. The light emitting diode component of claim 2, wherein the plurality of p-type doping layers are arranged between the plurality of n-type doping layers and the body, and the p-type doping layer of one of adjacent two P-N diode structures of the plurality of P-N diode structures is electrically coupled to the n-type doping layer of the other of the adjacent two P-N diode structures of the plurality of P-N diode structures through an interconnect structure.

9. A light emitting diode circuit in a display device, comprising:
    a plurality of transistors, wherein first terminals of the plurality of transistors are electrically coupled with each other and configured to receive a first reference voltage; and
    a light emitting diode component, electrically coupled between the plurality of transistors and a second reference voltage, wherein the light emitting diode component comprises a plurality of P-N diodes, and the plurality of P-N diodes are coupled in series with each other and integrated on a single chip;
    wherein the plurality of the transistors are configured to drive the light emitting diode component to emit light, and a second terminal of each of the plurality of transistors is electrically coupled to an anode of a corresponding one of the plurality of P-N diodes;
    wherein the light emitting diode component further comprises a plurality of first electrode pads and each of the plurality of first electrode pads is electrically coupled to the second terminal of one of the plurality of transistors;
    where in each one of the plurality of first electrode pads configured to receive the first reference voltage from the second terminal of a corresponding one of the plurality of transistors.

10. The light emitting diode circuit of claim 9, wherein:
    in response to a gate terminal of an mth transistor of the plurality of transistors which receives a gate driving signal, the mth transistor is configured to transmit the first reference voltage to an mth P-N diode of the plurality of the P-N diodes, to drive the mth P-N diode to an nth P-N diode of the plurality of the P-N diodes to emit light, wherein m and n are integers larger than 1, and m is smaller than or equal to n.

11. The light emitting diode circuit of claim 9, wherein:
    in response to an mth P-N diode of the plurality of the P-N diodes which is defected, a gate terminal of an (m+1)th transistor of the plurality of transistors is configured to receive a gate driving signal, and the (m+1)th transistor is configured to transmit the first reference voltage to an (m+1)th P-N diode of the plurality of the P-N diodes.

12. The light emitting diode circuit of claim 9, wherein the plurality of transistors are configured to be turned on in a sequential order in response to a plurality of different gate driving signals, to drive at least one of the plurality of the P-N diodes to emit light.

13. The light emitting diode circuit of claim 9, wherein the light emitting diode component comprises a plurality of electrode pads, each of the plurality of electrode pads is electrically coupled between a cathode or an anode of a corresponding one of the plurality of P-N diodes and a corresponding one of the plurality of the transistors, and the plurality of electrode pads are exposed as independent electrodes.

14. The light emitting diode circuit of claim 13, wherein the light emitting diode component further comprises at least one interconnect structure, and at least two of the plurality of the electrode pads are coupled in series through the at least one interconnect structure.

15. The light emitting diode circuit of claim 9, wherein the light emitting diode component further comprises a body, and the plurality of P-N diodes of the light emitting diode component are integrated on the body.

16. The light emitting diode circuit of claim 15, wherein the plurality of P-N diodes comprise a plurality of p-type doping layers and a plurality of n-type doping layers, and the plurality of p-type doping layers and the plurality of n-type doping layers are correspondingly arranged on the body.

17. The light emitting diode circuit of claim 16, wherein the p-type doping layer of a first P-N diode of the plurality of P-N diodes is electrically coupled to the n-type doping layer of a second P-N diode of the plurality of P-N diodes, and the second P-N diode is adjacent to the first P-N diode.

18. The light emitting diode circuit of claim 16, wherein the light emitting diode component further comprises:
- a plurality of second electrode pads, electrically coupled to the corresponding n-type doping layers in the plurality of P-N diodes;
- wherein the plurality of first electrode pads are electrically coupled to the corresponding p-type doping layers in the plurality of P-N diodes.

* * * * *